United States Patent [19]

Kikuchi et al.

[11] Patent Number: 5,337,368
[45] Date of Patent: Aug. 9, 1994

[54] FREQUENCY CONTROL SYSTEM IN AN AUDIO DEVICE

[75] Inventors: Susumu Kikuchi; Shiro Suzuki; Satoru Kodaira, all of Saitama, Japan

[73] Assignee: Poineer Electronic Corporation, Tokyo, Japan

[21] Appl. No.: 54,433

[22] Filed: Apr. 20, 1993

[30] Foreign Application Priority Data

Apr. 24, 1992 [JP] Japan ................... 4-131619
Apr. 1, 1993 [JP] Japan ................... 5-075554

[51] Int. Cl.⁵ ............................................. H03G 5/00
[52] U.S. Cl. ..................................... 381/103; 381/102
[58] Field of Search ................ 381/98, 101, 102, 103, 381/106, 110, 86

[56] References Cited

U.S. PATENT DOCUMENTS 3,292,116 12/1966 Walker et al. .................. 381/103
4,939,782 7/1990 Gambacurta, Jr. et al. ....... 381/103
5,172,358 12/1992 Kimura .......................... 381/102

FOREIGN PATENT DOCUMENTS 2016248 9/1979 United Kingdom.

Primary Examiner—Forester W. Isen
Attorney, Agent, or Firm—Nikaido, Marmelstein, Murray & Oram

[57] ABSTRACT

A frequency control system in an audio system has a low frequency band pass filter for deriving a low frequency component from an audio signal obtained from the audio system, and a high frequency band pass filter for deriving a high frequency component. A comparator is provided for comparing the level of the high frequency component with the level of the low frequency component, thereby producing a deviation of the high frequency component from a 1/f fluctuation. The audio signal is corrected with a correcting value to the 1/f fluctuation dependent on the deviation.

7 Claims, 19 Drawing Sheets

FIG.13 a
BPF 7
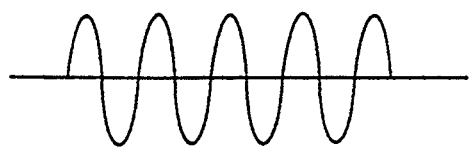
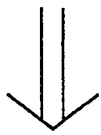
Ov ─────────
FIG.13 b
BPF 8
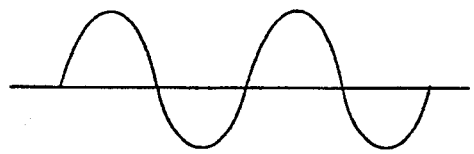
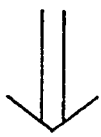
Ov ─────────

FIG.18

| $\Delta P = P_H - P_L$ (HEX) | -0F~-0A | -09~-05 | -04~-00 | -00~04 | 05~09 | 0A~0E | 0F~1F |
|---|---|---|---|---|---|---|---|
| BOOST INCREASE | 3 | 2 | 1 | — | — | — | — |
| BOOST DECREASE | — | — | — | — | 1 | 2 | 3 |

FREQUENCY CONTROL SYSTEM IN AN AUDIO DEVICE

BACKGROUND OF THE INVENTION

The present invention relates to a system for controlling the frequency of an audio signal to be reproduced by an audio device such as a tape deck.

It is preferable that the audio device, such as the receiver, tape player, and CD player, has a flat frequency characteristic. In order to obtain the flat frequency characteristic, various compensation methods are used in the audio system. However, the magnetic tape has not inherently the flat reproduction characteristic. Namely, an audio signal in a high frequency range recorded on the magnetic tape can not be sufficiently reproduced, in general. As a result, the reproduced music sound has often dull tone.

Meanwhile, it is known that stimuli having the 1/f fluctuation offer one comfort (U.S. Pat. No. 4,338,945). Namely, pleasant stimuli such as the frequency fluctuation of good music has the 1/f fluctuation. Here, the 1/f fluctuation is that the power-density spectrum of the quantity which fluctuates with time ($|F(j\omega)|^2$ where $F(j\omega)$ is Fourier transform of the quantity) is a fluctuation having the frequency distribution of $1/\omega$ ($\omega = 2\pi f$).

FIG. 1 shows reproduction characteristics of a CD and a magnetic tape on which a music is recorded, respectively. As is understood from the graph, the CD has a reproduction characteristic approximates to the 1/f fluctuation. However, the characteristic of the magnetic tape fairly deviates from the 1/f fluctuation.

If the recorded music on the magnetic tape is reproduced along the 1/f characteristic, the listener will feel at ease with the reproduced music.

SUMMARY OF THE INVENTION

An object of the present invention is to provide a frequency control system which may control the frequency of an audio signal to the 1/f fluctuation at the reproduction of a recording medium.

According to the present invention, there is provided a frequency control system in an audio system, comprising first deriving means for deriving a low frequency component from an audio signal obtained from the audio system, second deriving means for deriving a high frequency component, the frequency of which is higher than that of the low frequency component, from the audio signal.

A comparator is provided for comparing the level of the high frequency component with the level of the low frequency component and for producing a deviation of the high frequency component from a 1/f fluctuation. The level of the audio signal is corrected to the 1/f fluctuation with a correcting value dependent on the deviation.

In an aspect of the invention, each of the first and second deriving means is a band pass filter.

The comparator is arranged such that the deviation becomes zero when the level of the high frequency component coincides with the 1/f fluctuation.

The other objects and features of this invention will become understood from the following description with reference to the accompanying drawings.

BRIEF DESCRIPTION OF DRAWINGS

FIGS. 13a and 13b are diagrams showing rectified outputs of BPFs;

FIG. 18 is a list showing data used in the analyzing circuit of FIG. 16;

DETAILED DESCRIPTION OF THE PREFERRED EMBODIMENTS

Figure 1:
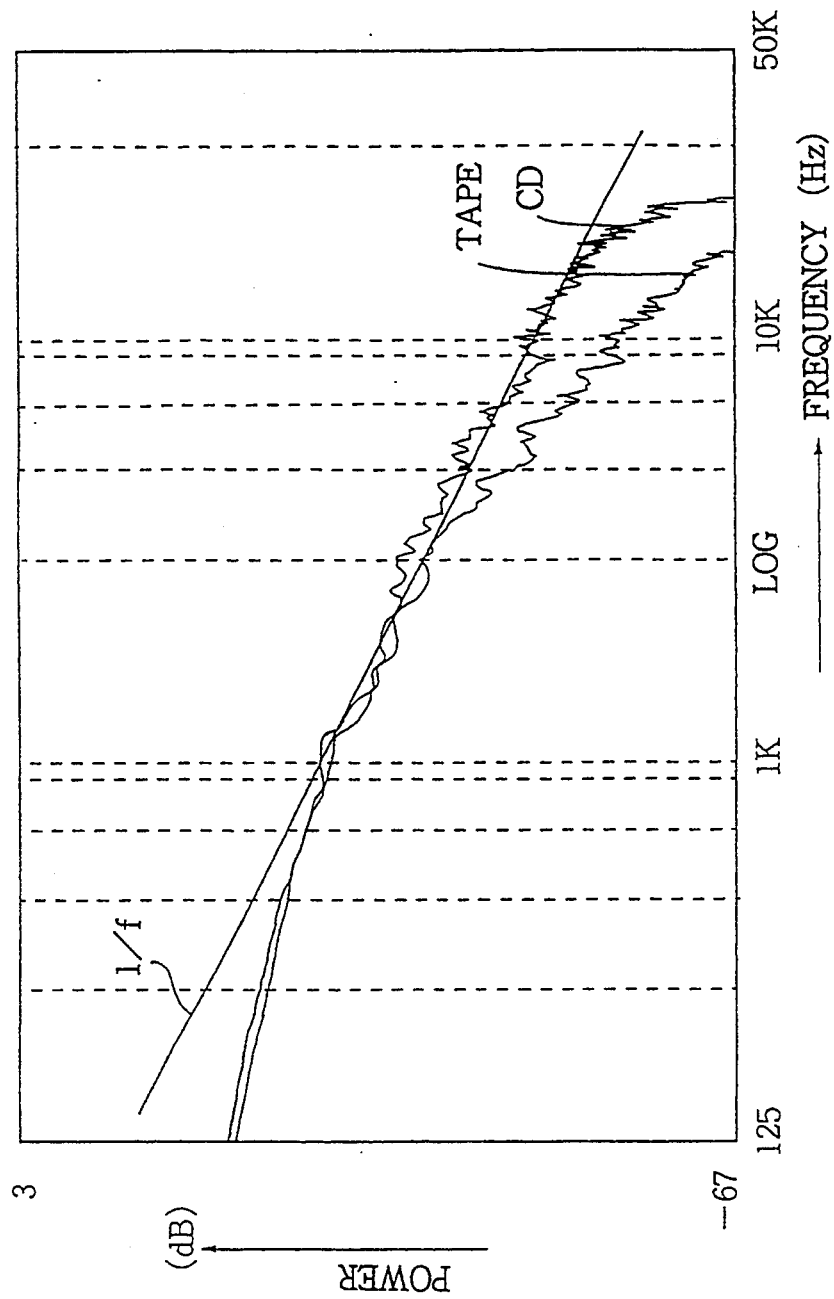
FIG. 1 is a graph showing reproducing characteristics of a CD and a magnetic tape by a conventional reproducing device.
Figure 2:
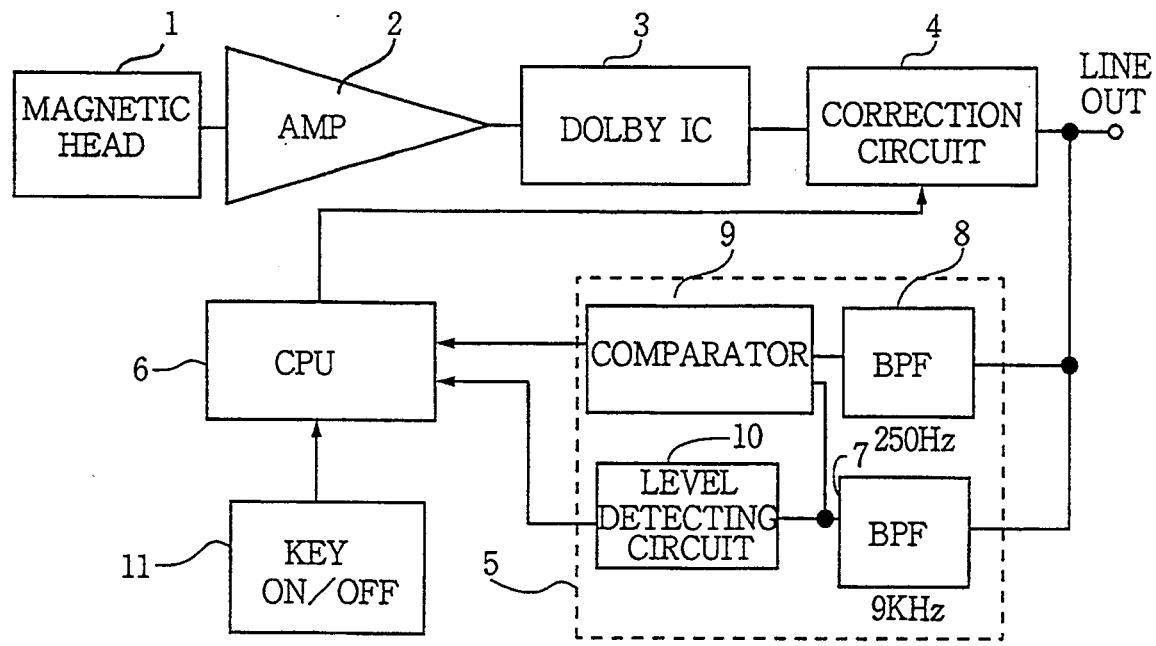
FIG. 2 is a block diagram showing a frequency control system according to the present invention.

Referring to FIG. 2 showing a frequency control system for a tape deck to which the present invention is applied, a music data recorded on a magnetic tape (not shown) is converted to an audio signal by a magnetic head 1 of the tape deck. The audio signal is applied to an amplifier 2 of the system. The amplifier 2 amplifies the audio signal to a predetermined level. The amplified signal is applied to a Dolby IC 3 where hiss noise of the tape is reduced. A correction circuit 4 is provided for correcting the level of the audio signal in a high frequency range in accordance with the 1/f fluctuation. The correction circuit 4 is connected to an analyzing circuit 5 which analyzes the power spectrum of the audio signal. The analyzed result is applied to a CPU 6 which operates the correction circuit 4 based on the analysis. An ON/OFF key 11 is connected to the CPU 6 for operating the system.

The analyzing circuit 5 comprises a BPF (band pass filter) 7 having a center frequency of 9 kHz, a BPF 8 having a center frequency of 250 Hz, a comparator 9 applied with output signals of the BPFs 7 and 8 for comparing the high frequency signal from the BPF 7 with the low and middle frequency signal from the BPF 8, and a level detecting circuit 10 applied with the output signal of the BPF 7 for detecting the level of the high frequency signal. The output signals of the comparator 9 and the level detecting circuit 10 are applied to the CPU 6.

Figure 3:
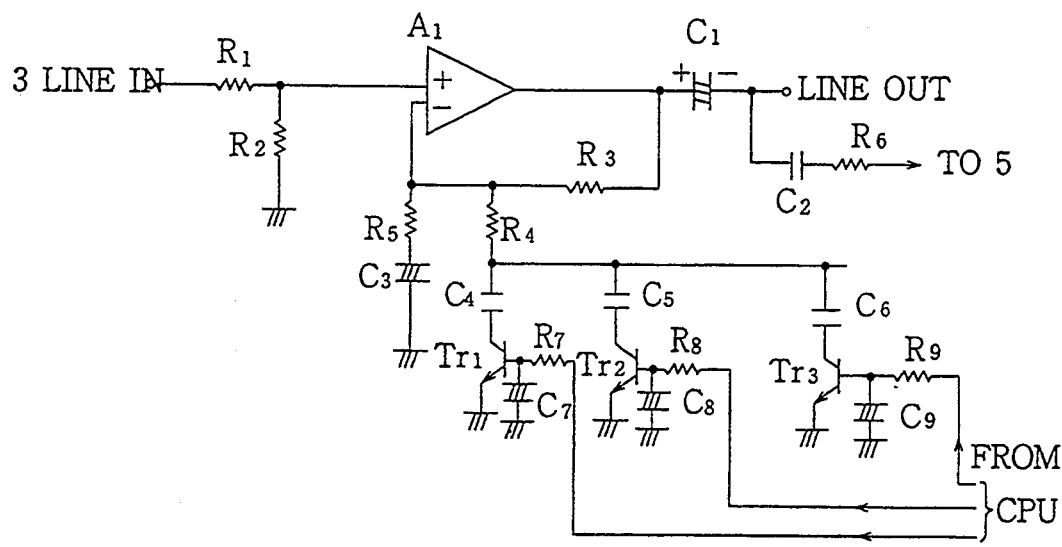
FIG. 3 is a circuit diagram of a correction circuit provided in the system.

FIG. 3 shows the correction circuit 4 in one of the L and R channels.

The output of the Dolby IC 3 is applied to a noninverting input terminal of an operational amplifier A1 through a resistor R1. An inverting input terminal of the operational amplifier (hereinafter called opamp) is connected to the ground through a resistor R5 and a capacitor C3 which are connected in series. An output terminal of the opamp A1 is connected to the inverting input thereof through a resistor R3. The output terminal of the opamp A1 is connected through a capacitor C1 to a power amplifier of the tape deck and to the analyzing circuit 5 through a capacitor C2 and a resistor R6.

Transistors Tr1, Tr2 and Tr3 are parallely disposed with respect to the opamp A1. Collectors of the transistor are connected to the inverting input terminal of the opamp A1 through a resistor R4 and through capacitors C4, C5 and C6, respectively. Emitters of the transistors are connected to the ground, and the base of the transistors are grounded through capacitors C7, C8 and C9. The CPU 6 is connected to respective bases of transistors Tr1, Tr2 and Tr3 through resistors R7, R8 and R9. The capacitors C7, C8 and C9 and the resistors R7, R8 and R9 are provided for reducing noise when a base voltage changes.

Figure 4:
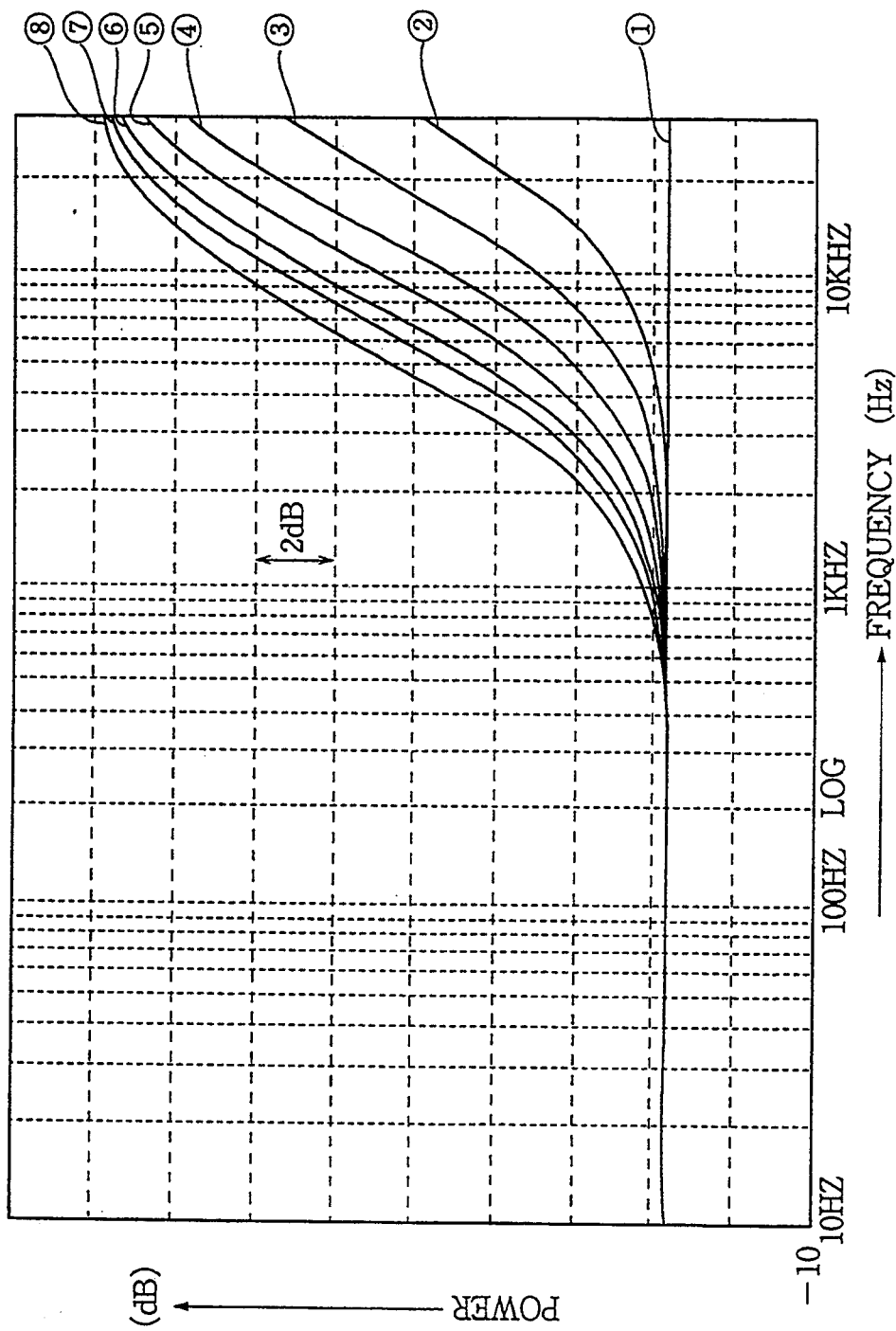
FIG. 4 is a diagram showing correction curves used in the correction circuit.

FIG. 4 shows curves of correcting steps ① to ⑧ provided in the correction circuit 4. At an initial period, if the level of the middle and high frequency can not be corrected to the desired level with the curve of the step ① the level is further raised in accordance with a correcting step ②. At the next period, if the level of the middle and high frequency is not sufficiently corrected, the level is more raised in accordance with a correcting step ③. Thus, the audio signal is controlled to the 1/f fluctuation, as described hereinafter.

Figure 5:
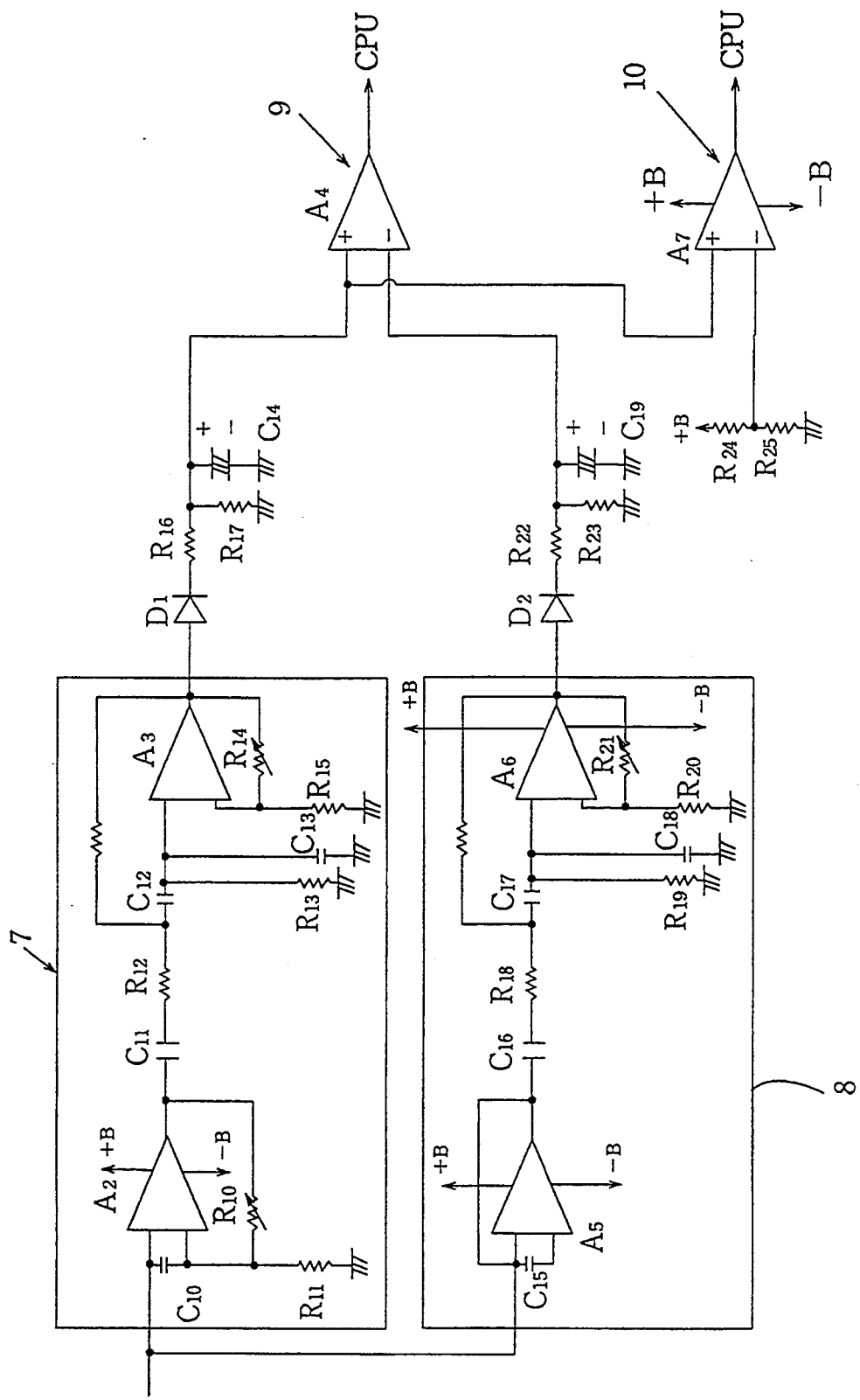
FIG. 5 is a circuit diagram of a spectrum analyzing circuit provided in the system.

FIG. 5 is a circuit diagram of the analyzing circuit 5. The BPF 7 has opamps A2 and A3. Input terminals of the opamp A2 are short-circuited by a capacitor C10. One of the input terminals of the opamp A2 is applied with a voltage divided by resistors R10 and R11. An output terminal of the opamp A2 is connected to one of the input terminals of the opamp A3 through a capacitor C11, a resistor R12 and a capacitor C12. A resistor R13 and a capacitor C13 are connected between the capacitor C12 and the input terminal. The other input terminal of the opamp A3 is applied with a voltage divided by resistors R14 and R15.

An output terminal of the opamp A3 is connected to a first rectifier comprising a diode D1, resistors R16 and R17 and a capacitor C14. The output of the first rectifier is applied to a noninverting input terminal of a comparator A4 as the comparator 9.

The BPF 8 has opamps A5 and A6. Input terminals of the opamp A5 are short-circuited by a capacitor C15. An output terminal of the opamp A5 is connected to one of the input terminals of the opamp A6 through a capacitor C16, a resistor R18 and a capacitor C17. A resistor R19 and a capacitor C18 are connected between the capacitor C17 and the input terminal. The other input terminal of the opamp A6 is applied with a voltage divided by resistors R20 and R21.

An output signal of the opamp A6 is applied to a second rectifier comprising a diode D2, resistors R22 and R23 and a capacitor C19. The output of the second rectifier is applied to an inverting input terminal of the comparator A4 as the comparator 9.

The level detecting circuit 10 comprises a comparator A7. The output signal of the opamp A3 is applied to a noninverting input terminal of the comparator A7. An inverting input terminal thereof is applied with a reference voltage divided by resistors R24 and R25.

FIGS. 13a and 13b show outputs of the first and second rectifiers which can be regarded as the outputs of the BPFs 7 and 8.

The BPFs 7 and 8 are so arranged that when the outputs thereof vary along the 1/f fluctuation, the outputs become equal to each other so that the output of the comparator A4 is zero.

Since the power of 1/f fluctuation decreases with the frequency, the output of the higher frequency BPF7 must be smaller than that of the BPF 8. To this end, the gain of the BPF 7 is set to a lower value than the BPF 7.

The difference in gain will be described hereinafter with reference to FIGS. 6 to 10.

Figure 6:
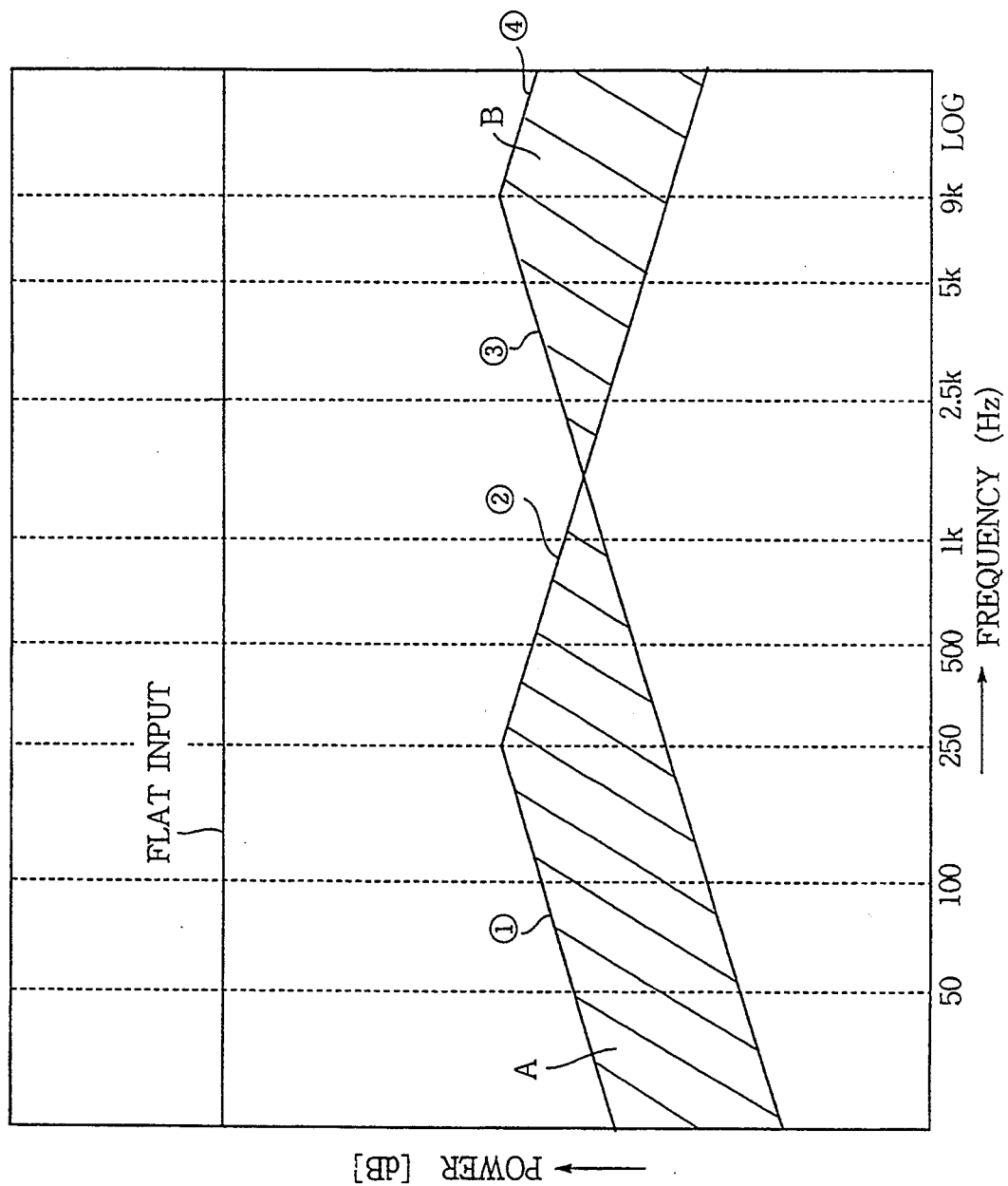
FIGS. 6 to 10 are graphs for explaining gain differences of band pass filters at various input signals.

FIG. 6 shows the outputs of the BPF 7 and 8 in the audible frequency range (20 Hz -20 kHz) when the input signal is flat. Lines ① and ② represent the output of the BPF 8, and lines ③ and ④ represent the output of the BPF 7. The gain of each BPF can be represented by the area below the output line. Consequently, the difference between both the gains is the difference between the areas of the hatched zones A and B. Since the cener frequency of the BPF 7 is 9 kHz derided to the upper limit, the area of the B zone is smaller than that of the A zone.

In order to equalize both the inputs to the comparator A4 at the 1/f input, the gain of the BPF 7 is increased, including the difference of the area B from Area A.

Figure 12:
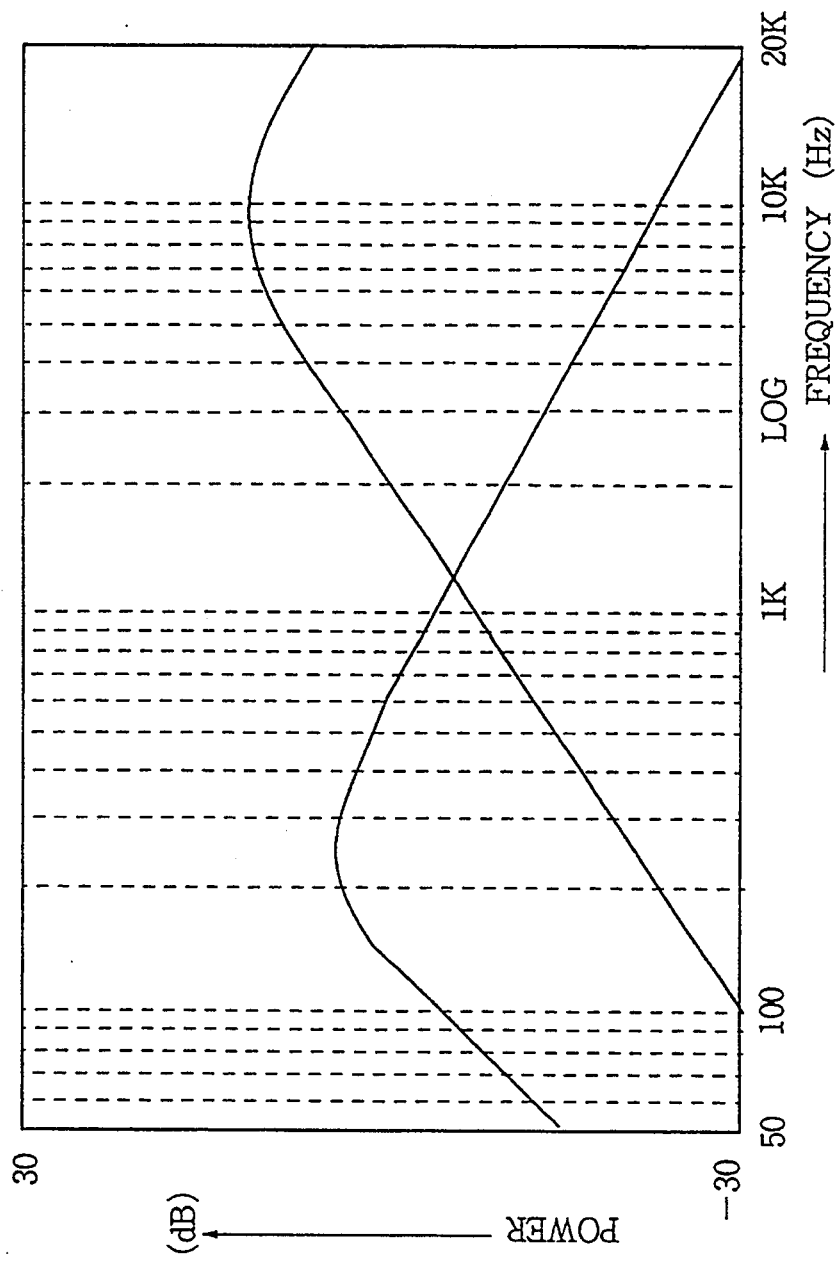
FIG. 12 is a diagram showing characteristics of BPFs.

FIG. 12 shows a raised power of the BPF 7. The power is increased about 7.9 dB.

Figure 7:
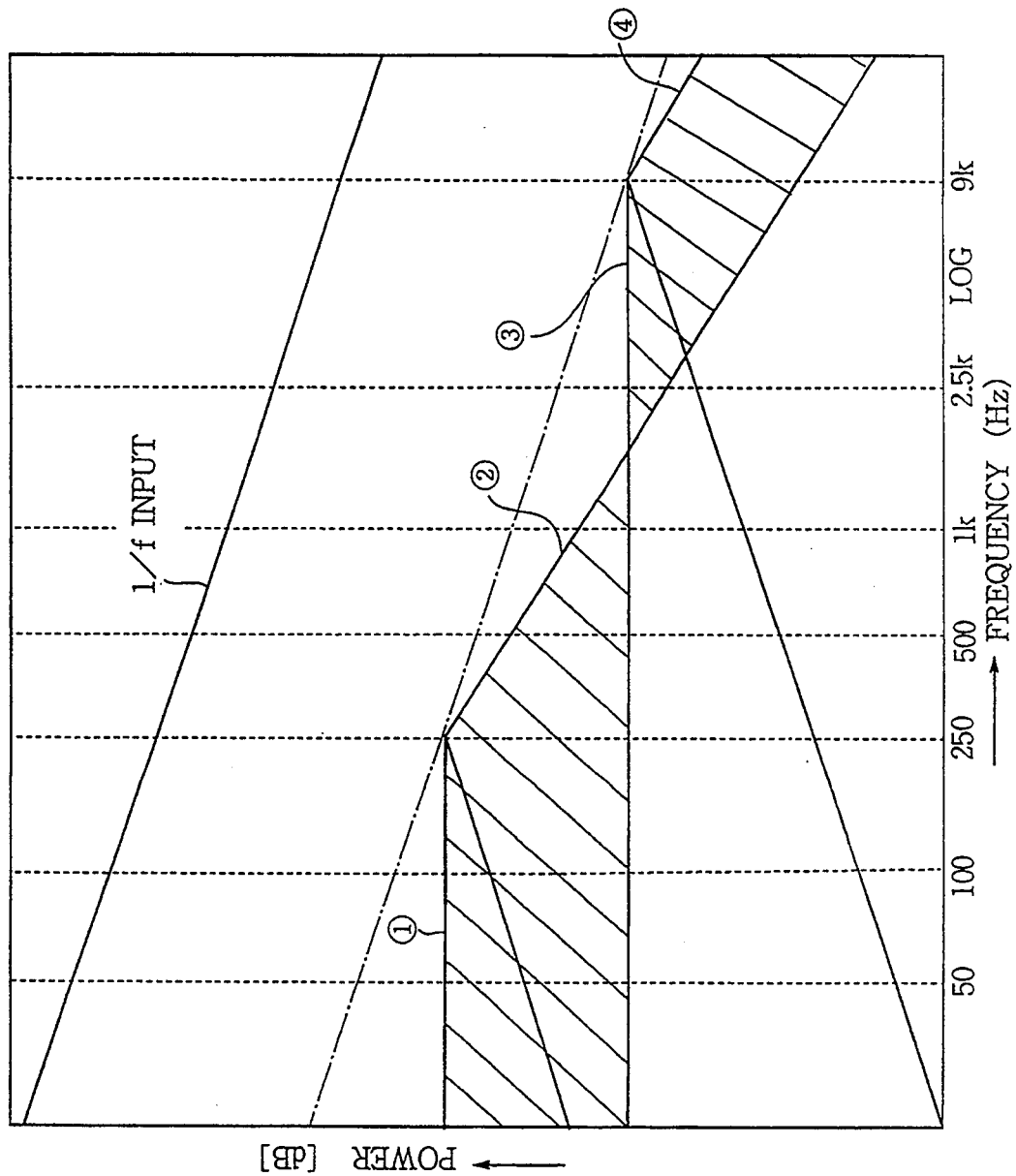

FIG. 7 shows the output powers of the BPFs 7 and 8, where the output of the BPF 7 is not increased, at the 1/f input. Since the input level decreases with the frequency, the output power of the BPF 7 is small. As is described about FIG. 6, the inputs for the comparator A4 become equal to each other by increasing the gain of the BPF 7 by 7.9 dB.

Figure 8:
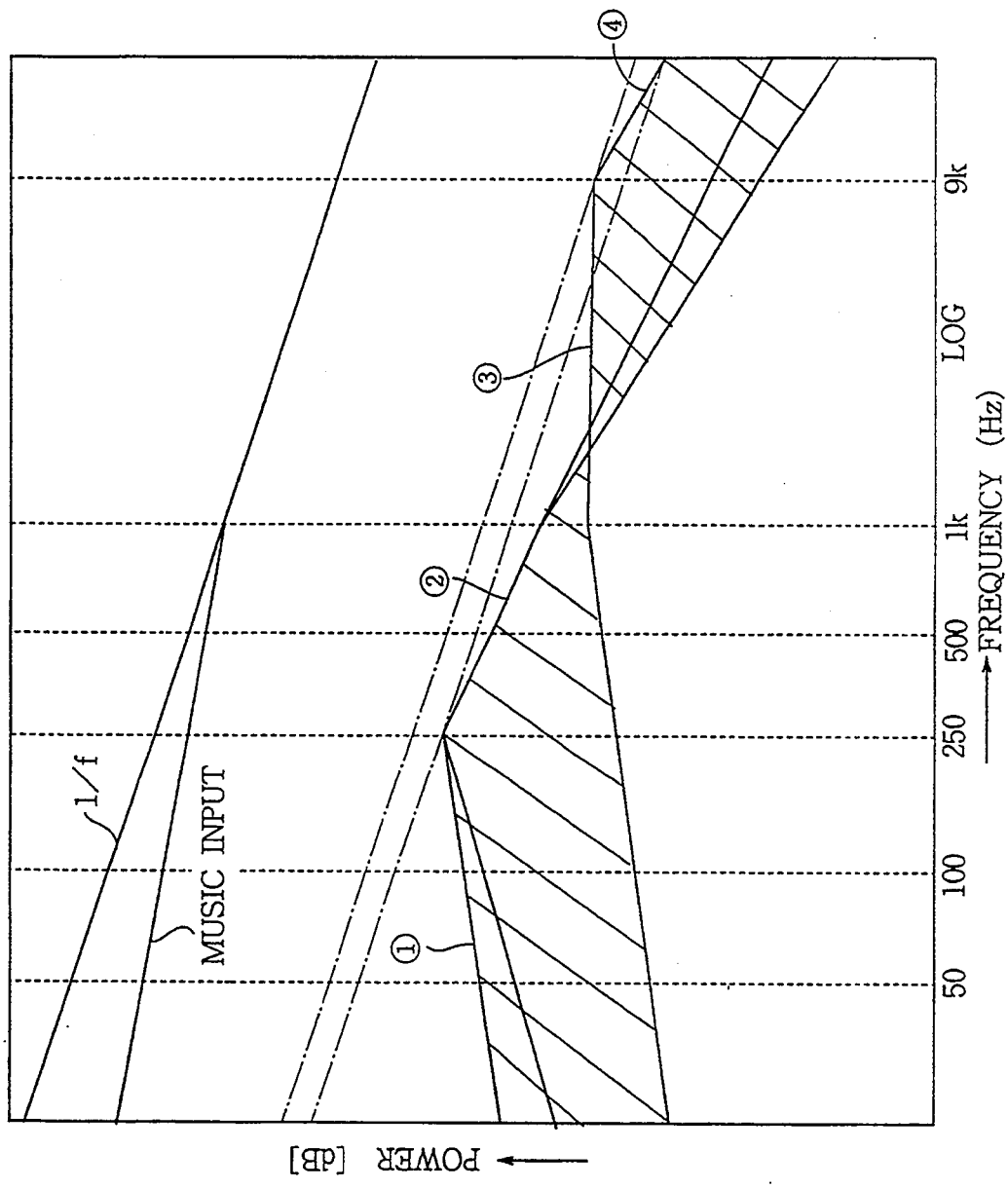

FIG. 8 shows the output powers of the BPFs 7 and 8 at a music input. The music input deviates from the f fluctuation in a lower frequency range from 1 kHz.

Figure 9:
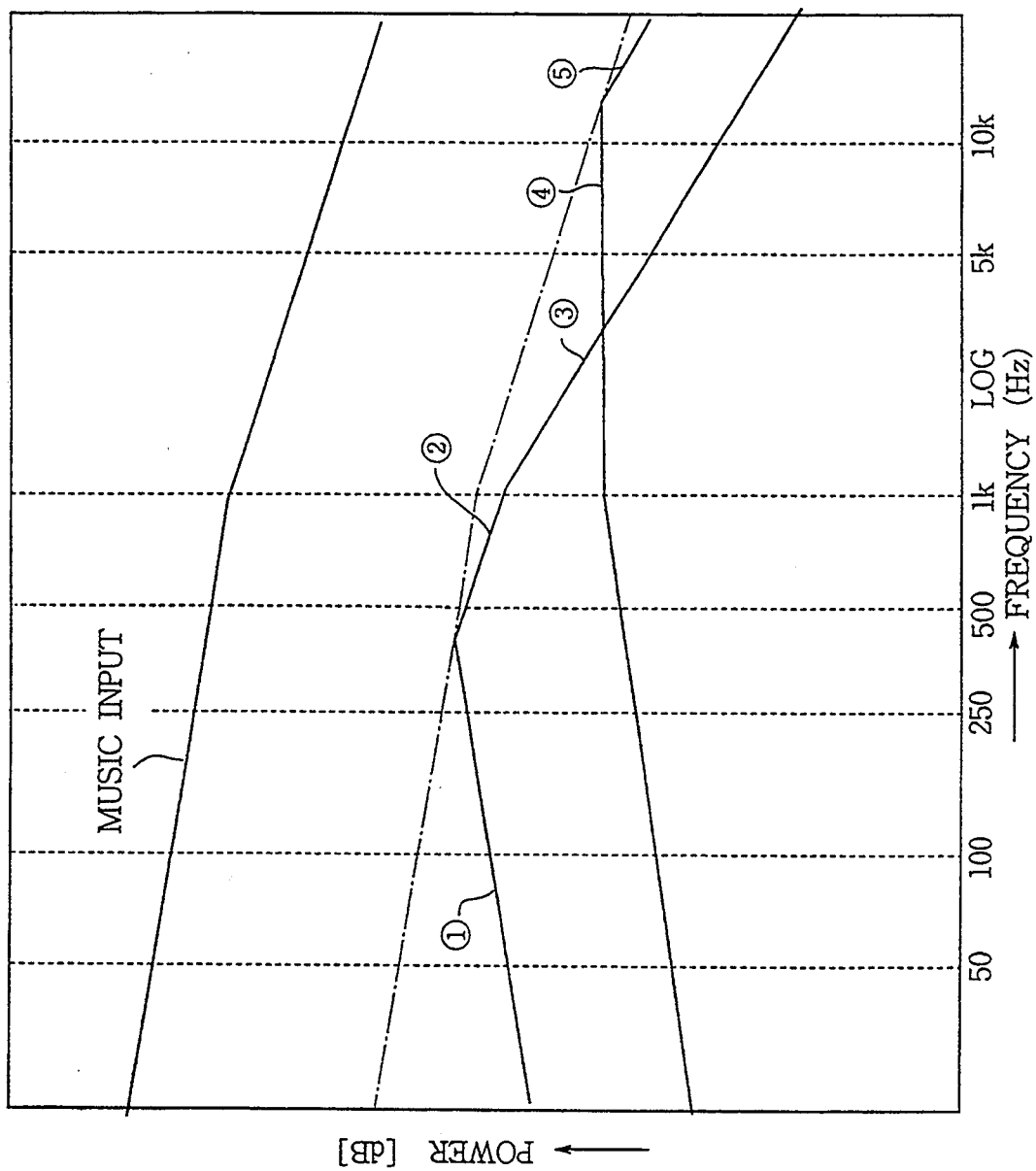

FIG. 9 shows output powerf of BPF 7 having a center frequency of 5 kHz and of BPF 8 having a center frequency of 100 Hz.

Figure 10:
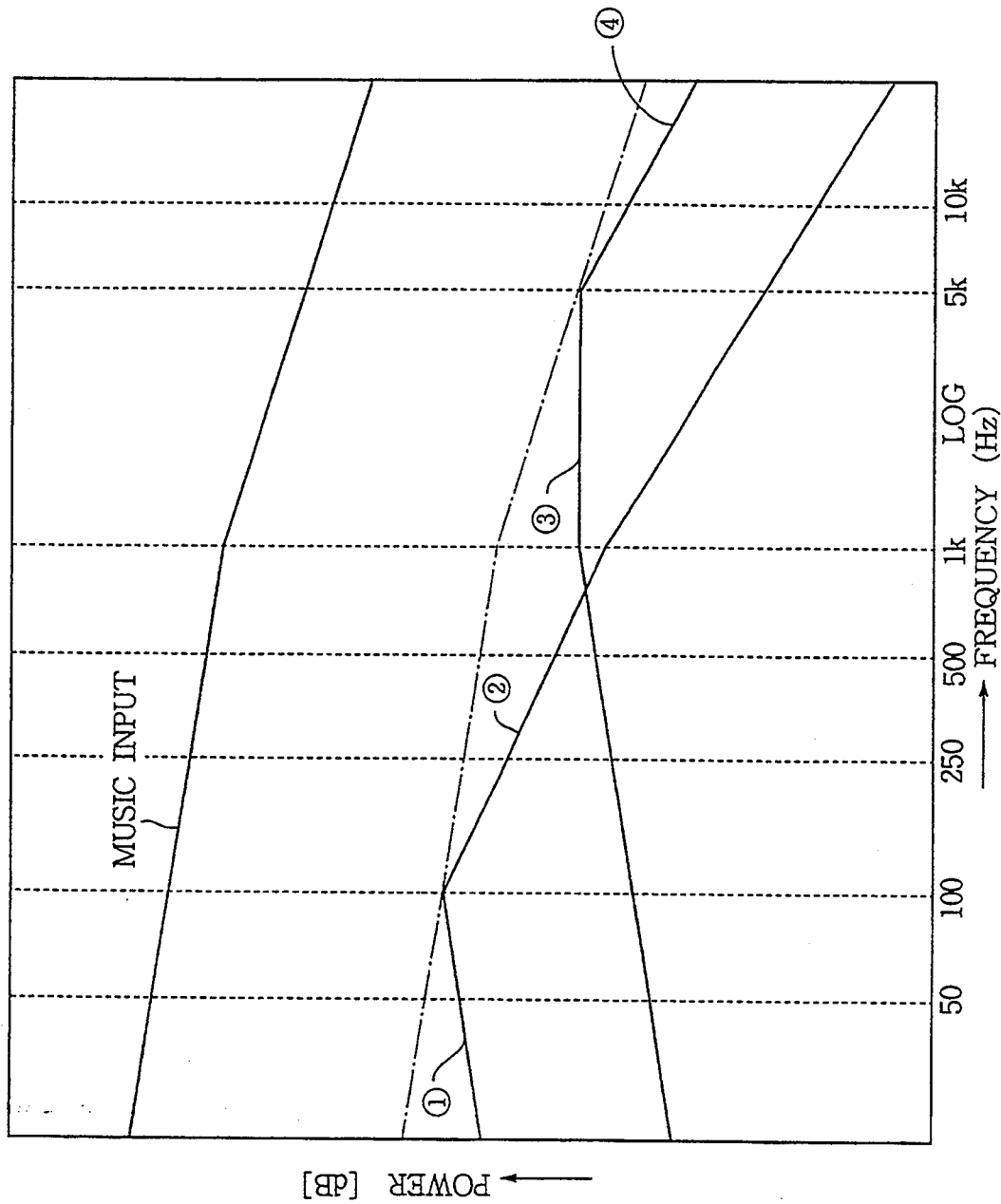

FIG. 10 shows output powers of BPFs 7 and 8 having a center frequency of 12.5 kHz and a center frequency of 400 Hz, respectively. Even if the center frequencies of the BPFs are changed, the function of the system does not change.

Figure 11:
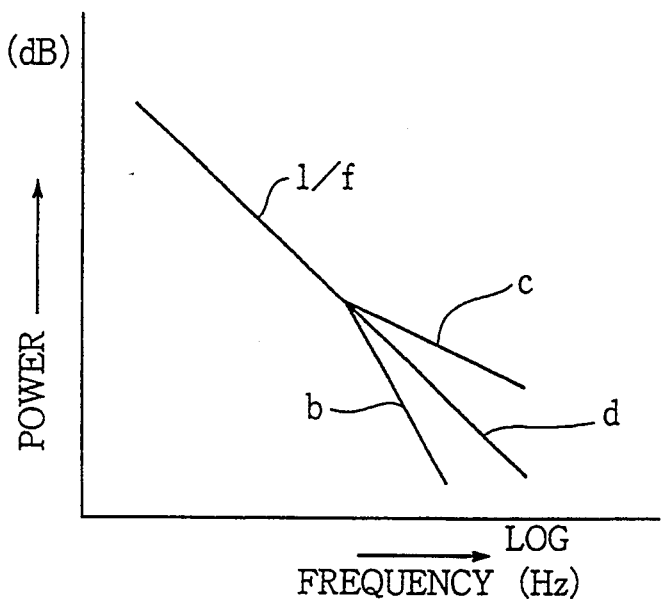
FIGS. 11a, 11b, 11c and 11d are diagrams showing outputs of a comparator provided in the analyzing circuit.
Figure 11:
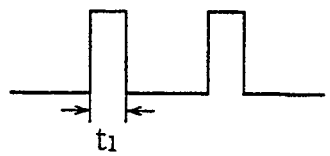
Figure 11:
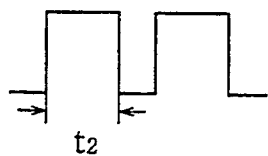
Figure 11:
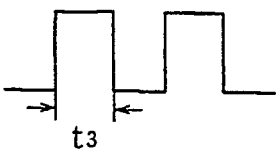

FIGS. 11b to 11d show outputs of the comparator A4. If the input to the comparator oscillates along the 1/f as shown by d in FIG. 11a, the output of the comparator becomes pulses shown in FIG. 11d. More particularly, since the output pulses oscillate with respect to zero at approximately equal amplitudes, the width t3 of the H level is equal to the width of the L level.

If the input deviates to the lower side as shown by b in FIG. 11a, the width t1 of the H level becoms smaller than t3 as shown in FIG. 11b.

When the input deviates to the higher side, the width t2 becomes larger than t3 as shown in FIG. 11c.

The operation of the system will be described. Referring to FIG. 2, the audio signal obtained by the magnetic head 1 is amplified by the amplifier 2 to a predetermined level. The hiss noise of the tape is reduced at the Dolby IC 3. The high frequency of the signal is corrected at the correction circuit 4 in accordance with the 1/f fluctuation characteristic.

The analyzing circuit 5 analyzes the power spectrum of the audio signal. The BPF 8 extracts waveforms near the level of 250 Hz. The output of BPF 8 is rectified by the second rectifier shown in FIG. 5. Similarly, the BPF 7 extracts waveforms near the level of 9 kHz. The output of BPF 7 is rectified by the first rectifier.

The comparator 9 compares the output voltage of the BPF 7 with the output voltage of the BPF 8. The comparator 9 produces one of the pulses shown in FIGS. 11b to 11d as described above.

The level detecting circuit 10 detects the level of the output voltage of the BPF 7 by comparing the output voltage with the reference voltage dependent on the resistors R24 and R25.

Generally, the classical music has a low level sound in a high and middle frequency range about 9 kHz. If the correction circuit 4 is operated to increase the level of the signal in the high frequency range based on the 1/f fluctuation, high frequency sound is unnaturally increased, that is a jarring sound is reproduced. In order to avoid such an unpleasant sound, only when the output voltage of the BPF 7 exceeds the reference voltage, the correction of the level is performed.

Figure 14:
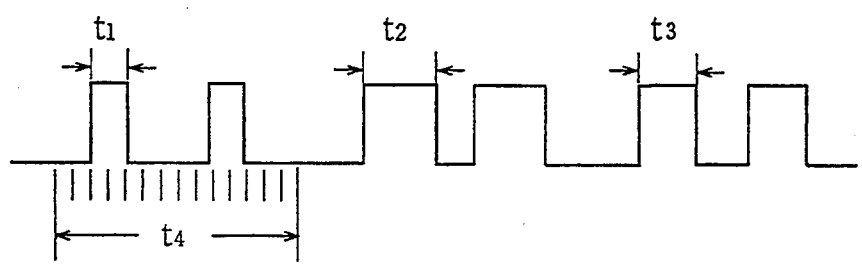
FIG. 14 is a diagram showing a sampling period of a CPU provided in the system.

In order to measure the width of the output pulse of the comparator A4, the CPU 6 samples the pulse for a period t4 (for example, 2 sec) as shown in FIG. 14. The sampling is performed at the interval of 10 msec.

In sampling operation, the number of "H" level outputs in the period t4 is counted. It is determined whether the counted number coincides with the count number of the pulse width t3 as the standard pulse. If the count number coincides with that of the standard pulse width t3, no correction is performed at the correction circuit 4.

If the count number is smaller than the reference count number, it means that the high frequency is reduced in level. The CPU 6 operates to selectively turn on the transistors Tr1, Tr2 and Tr3 of the correction circuit 4 of FIG. 3 so as to coincide the count number with the reference count. Namely, the gain of the amplifier A1 is increased until the count number coincides with the reference number. The correcting operation of the correction circuit 4 is performed in accordance with the correction steps of FIG. 4.

To the contrary, if the count number is larger than the reference count number, the CPU 6 operates to turn off the transistors to reduce the operating number of transistors. Thus, the gain of opamp A1 is reduced. The correction circuit 4 operates to correct the audio signal by reducing the correction step of FIG. 4 until the count number coincides with the reference number of the 1/f fluctuation characteristic. Thus, the audio signal is corrected to the 1/f fluctuation.

Although the above described correcting operation is continuously performed during the reproduction, other correcting modes can be employed. For example, the correcting value is fixed to one of the steps of FIG. 4 when a predetermining sampling operation has been achieved. The sampling period t4 may be gradually reduced as the sampling operation proceeds, for example 2 sec→1 sec→0.5 sec.

A high pass filter and a low pass filter can be used instead of the BPFs 7 and 8. The system of the present invention can be applied to a receiver such as the AM receiver.

Furthermore, the system of the present invention can be used for adjusting the azimuth. When the azimuth is aligned, the output level of the BPF 7 at 10 kHz becomes maximum. Hence, by counting the H level of the output the point where the output level is maximum can be detected. Thus, the azimuth alignment can be achieved and the point may be displayed.

Figure 15:
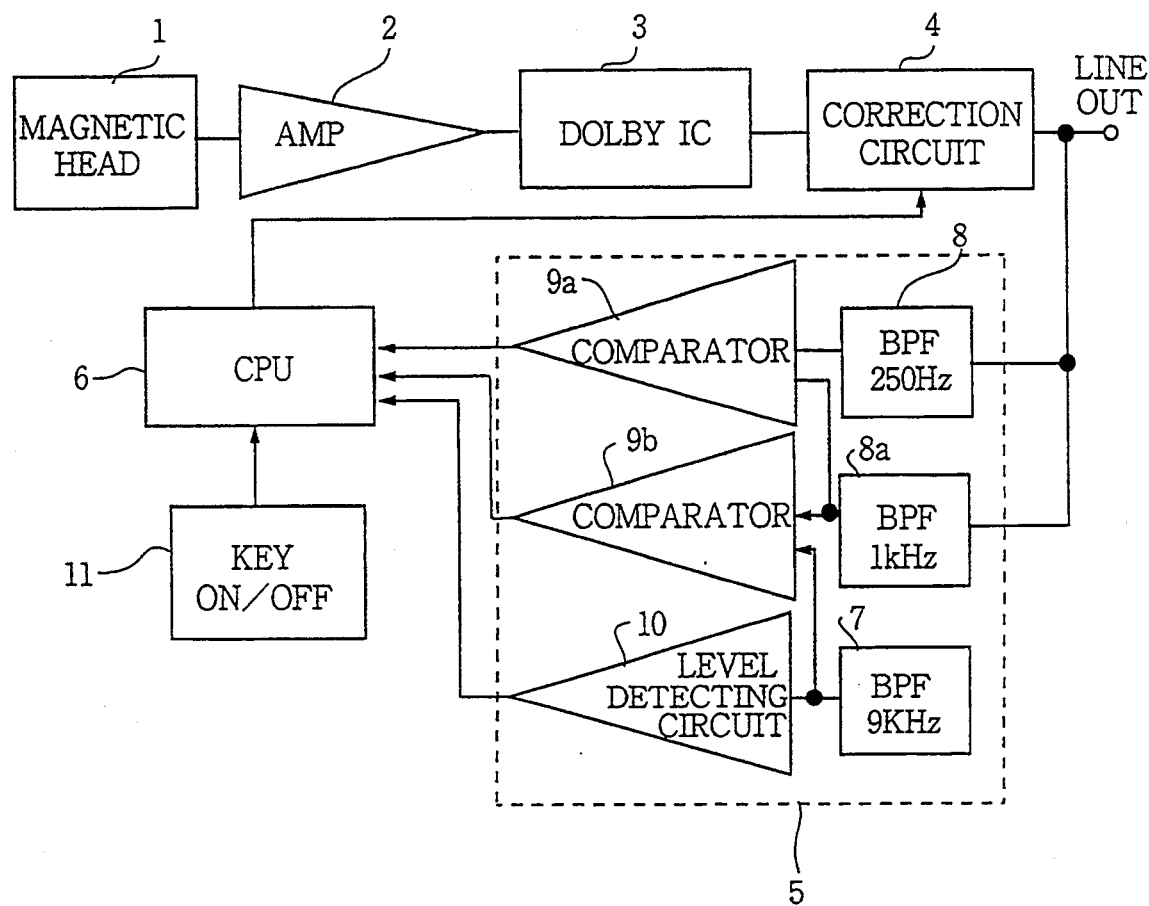
FIG. 15 is a block diagram showing another embodiment of the system.

Referring to FIG. 15 showing another embodiment of the frequency control system of the present invention, in the analyzing circuit 5, a BPF 8a having a center frequency of 1 kHz is added, and a pair of comparators 9a and 9b are provided. The output signals of the BPFs 8 and 8a are applied to the comparator 9a and the output signals of the BPFs 8a and 7 are applied to the comparator 9b. By increasing the number of the BPFs, the accuracy of the analysis of the power is improved.

If the number of comparators is C and the number of BPFs is N, the relationship there-between is represented as N-C=1. It is not always better to increase the number of BPFs because the accuracy does not proportionally increase.

Figure 16:
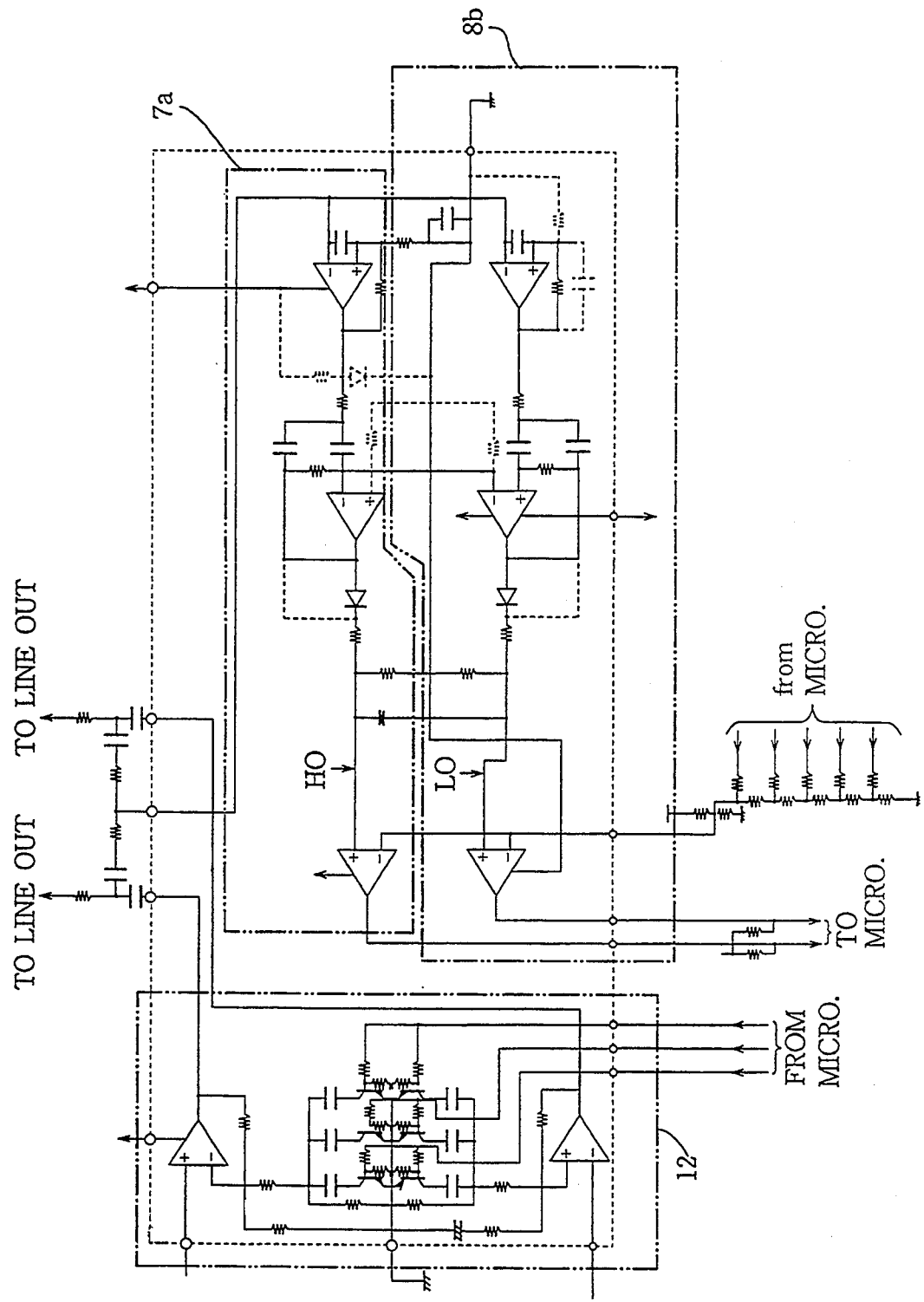
FIG. 16 is a circuit diagram showing another embodiment of the analyzing circuit.

FIG. 16 shows another embodiment of the analyzing circuit 5 which comprises a high band pass filter 7a, a low band pass filter 8b and a booster circuit 12 as the correcting circuit.

The outputs of the BPFs 7a and 8b are applied to a microcomputer (not shogun) where the outputs are converted to digital signals. The microcomputer reads the absolute value of each digital signal and calculates the difference ΔV between the absolute values. The booster circuit 12 produces a boost quantity in accordance with the difference ΔV for correcting the audio signal to the 1/f fluctuation. The correction is periodically performed.

Figure 17:
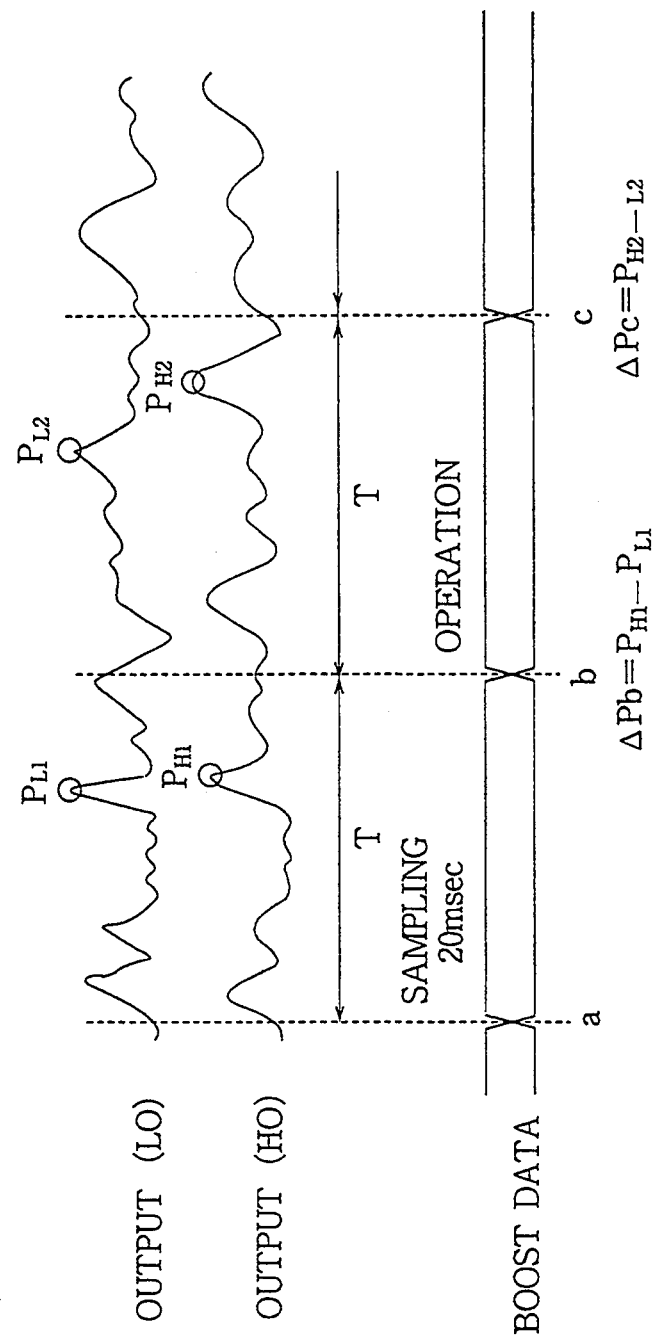
FIG. 17 is a diagram showing operations of the analyzing circuit of FIG. 16.

The correcting operation is described in more detail with reference to FIG. 17. The sampling and operation are performed at regular intervals T. In the sampling period, the output (HO) of the high band pass filter 7a and the output (LO) of the low band pass filter 8b are applied to the microcomputer where both outputs are converted to digital values, and a maximum value $P_L$ and a maximum value $P_H$ in each output are detected. At each point (a, b, c—) between the periods, the difference ΔP is obtained (ΔP=$P_H$−$P_L$). In the operation period, a boost data is determined in accordance with the difference ΔP. The boost data is changed only at the points (a, b, c—).

There is provided a difference between gains of both BPFs 7a and 8b so that the difference ΔP becomes zero when the 1/f signal is applied thereto.

FIG. 18 shows an example of the changing of boost data. In the embodiment, the converted digital signal is composed by 5 bit. Hence, the difference ΔP becomes between −1 FH and +1 FH (hexadecimal).

Figure 19:
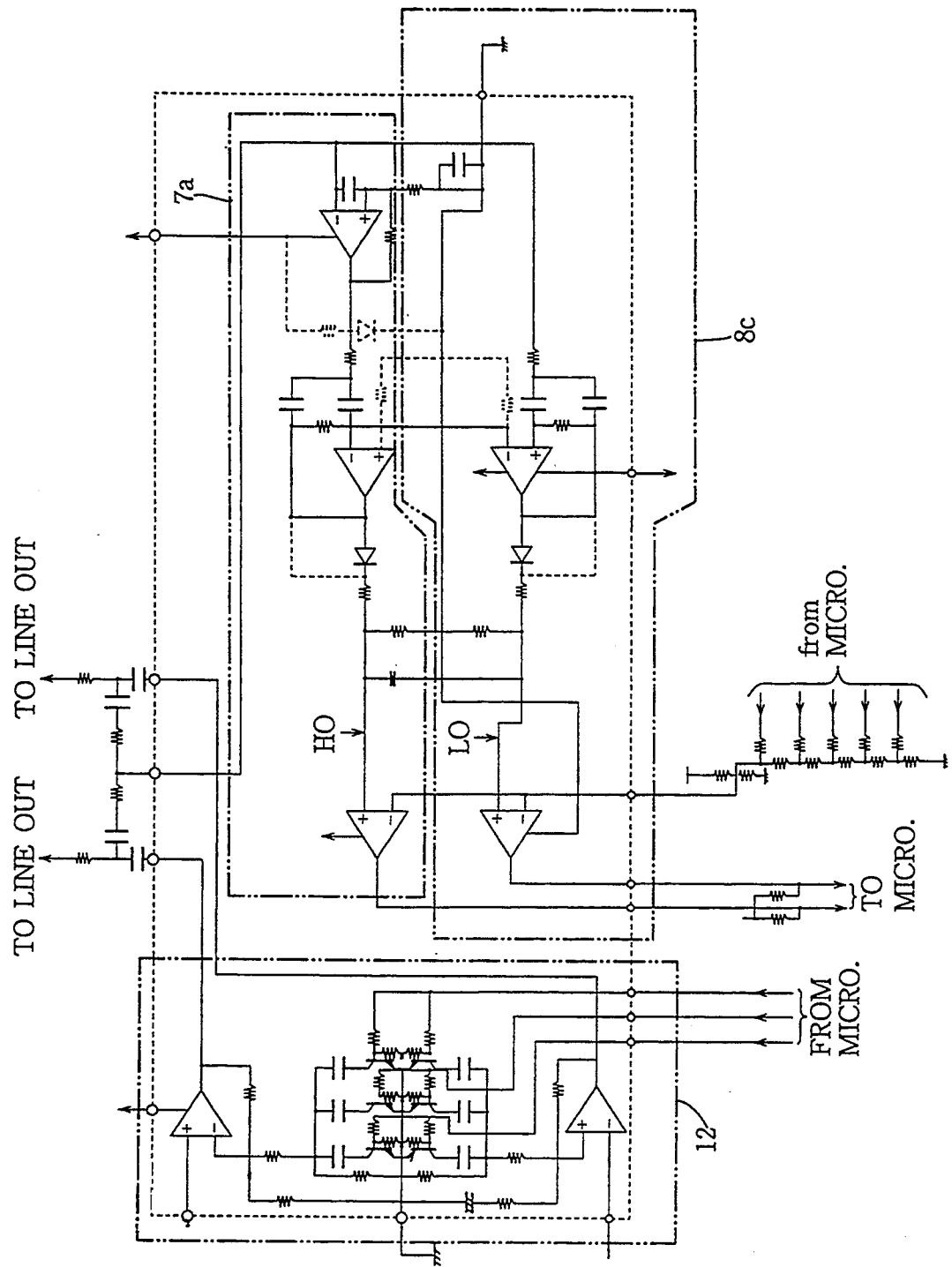
FIG. 19 is a circuit diagram showing a modification of the analyzing circuit of FIG. 16.

FIG. 19 shows a modification of the analyzing circuit of FIG. 16 where the BPF 8a of FIG. 16 is changed into an amplifier 8c. In the system, the amplifier 8c amplifies the audio signal in the entire audible frequency range.

The outputs of the BPF 7 and the amplifier 8c are converted to digital values, and the difference ΔV' is calculated by the microcomputer. A boost value is obtained in accordance with the difference ΔV' in the same manner as the system of FIG. 16.

In the system of FIG. 5, the gain of BPF 7 is corrected with the correcting value of FIG. 4, the value of which varies with frequency. However, other correcting methods may be employed.

Figure 20:
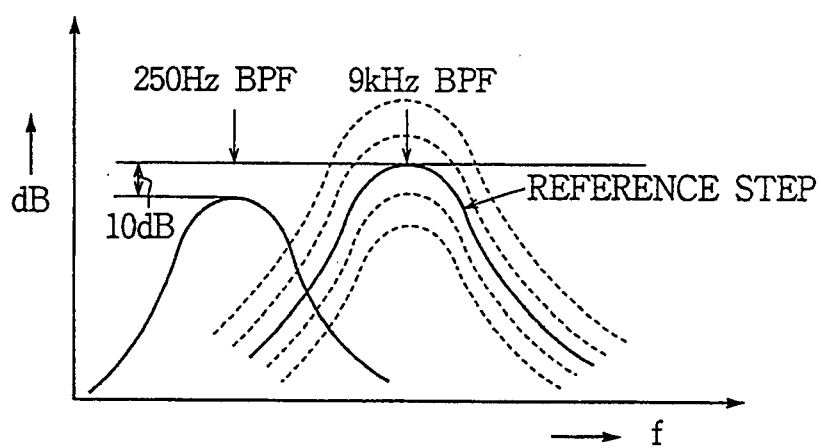
FIG. 20 is a diagram showing operations of the analyzing circuit of FIG. 19.

FIG. 20 shows an example of the correcting method. The system is arranged such that the gain of the BPF 7 can be stepwise changed as shown by dotted line. The outputs of BPFs 7 and 8 are rectified, and the voltages of the rectified direct currents are compared with each other by the comparator. The comparator is set so that when the input signal from the BPF 7 has 1/f fluctuation, the output of the comparator becomes zero. The reference step in FIG. 20 is the step at output of zero. By sampling the H level output and counting the number of the outputs, the deviation of the output of the BPF 7 is detected. The gain of the BPF 7 is changed based on the deviation until the output becomes zero, and the number of the changing steps. Thus, the output of BPF 7 is corrected to the 1/f fluctuation.

While the presently preferred embodiments of the present invention has been shown and described, it is to be understood that these disclosures are for the purpose of illustration and that various changed and modifications may be made without departing from the scope of the invention as set forth in the appended claims.

What is claimed is:

1. A frequency control system in an audio system, comprising:

first deriving means for deriving a low frequency component from an audio signal obtained from the audio system;

second deriving means for deriving a high frequency component, the frequency of which is higher than that of the low frequency component, from the audio signal;

comparator means for comparing the level of the high frequency component with the level of the low frequency component, and for producing a deviation of the high frequency component from a 1/f fluctuation; and correcting means for correcting the level of the audio signal to the 1/f fluctuation dependent on said deviation.

2. The system according to claim 1 wherein said first and second deriving means are a low frequency band pass filter and a high frequency band pass filter, respectively.

3. The system according to claim 1 wherein said first deriving means is a low pass filter.

4. The system according to claim 1 wherein said second deriving means is a high pass filter.

5. The system according to claim 1 wherein said comparator means is arranged such that said deviation becomes zero when the level of the high frequency component coincides with the 1/f fluctuation.

6. The system according to claim 1 wherein said correcting means corrects the level of the audio signal with a correcting value dependent on said deviation.

7. The system according to claim 2 wherein gain of said high frequency band pass filter is changed such that said deviation becomes zero when the level of the output of the band pass filter coincides with the 1/f fluctuation.

* * * * *